United States Patent
Lee et al.

(10) Patent No.: US 10,504,351 B2
(45) Date of Patent: Dec. 10, 2019

(54) METHOD AND APPARATUS FOR DETECTING ABNORMAL EVENT RELATED TO PERSON AT HOME

(71) Applicant: Encored Technologies, Inc., Seoul (KR)

(72) Inventors: Hyoseop Lee, Seoul (KR); Jongwoong Choe, Seoul (KR)

(73) Assignee: Encored Technologies, Inc., Seoul (KR)

( * ) Notice: Subject to any disclaimer, the term of this patent is extended or adjusted under 35 U.S.C. 154(b) by 0 days.

(21) Appl. No.: 15/848,672

(22) Filed: Dec. 20, 2017

(65) Prior Publication Data

US 2018/0182221 A1    Jun. 28, 2018

(30) Foreign Application Priority Data

Dec. 26, 2016    (KR) .......................... 10-2016-0178901

(51) Int. Cl.
*G08B 21/04*    (2006.01)
*H04L 12/28*    (2006.01)
*G01R 21/00*    (2006.01)

(52) U.S. Cl.
CPC .........  *G08B 21/0415* (2013.01); *G01R 21/00* (2013.01); *G08B 21/0423* (2013.01); *H04L 12/2825* (2013.01); *H04L 12/2834* (2013.01)

(58) Field of Classification Search
None
See application file for complete search history.

(56) References Cited

U.S. PATENT DOCUMENTS

| | | | |
|---|---|---|---|
| 2011/0276527 A1* | 11/2011 | Pitcher | ................ G06F 17/5009 706/21 |
| 2012/0240072 A1* | 9/2012 | Altamura | .............. G06T 11/206 715/771 |
| 2015/0002137 A1* | 1/2015 | Patel | .................... G01R 15/207 324/130 |
| 2015/0026109 A1 | 1/2015 | Park | |

(Continued)

FOREIGN PATENT DOCUMENTS

| JP | 200058484 A | 9/2000 |
|---|---|---|
| JP | 2003256951 A | 9/2003 |

(Continued)

OTHER PUBLICATIONS

Korea IP Office, Office Action in Korean Pat. App. No. 10-2016-0178901, dated Aug. 21, 2017 (Korean).

(Continued)

*Primary Examiner* — Leon Viet Q Nguyen
(74) *Attorney, Agent, or Firm* — John H. Choi & Associates

(57) ABSTRACT

A method and apparatus for detecting an abnormal event related to a person at home are provided. The method includes measuring home electricity use data in each first predetermined time interval, determining whether an abnormal event related to the person at home has occurred based on the home electricity use data, generating a notification message including the abnormal event related to the person at home when it is determined that the abnormal event related to the person at home has occurred, and transmitting the notification message to a predetermined user device.

20 Claims, 3 Drawing Sheets

(56) References Cited

U.S. PATENT DOCUMENTS

| | | | |
|---|---|---|---|
| 2015/0268281 A1* | 9/2015 | Haghighat-Kashani | G01R 21/00 702/62 |
| 2017/0235290 A1* | 8/2017 | Weber | H02J 3/14 700/276 |
| 2018/0090929 A1* | 3/2018 | Roberts | H02J 3/00 |

FOREIGN PATENT DOCUMENTS

| | | | |
|---|---|---|---|
| JP | 2005216113 A | 8/2005 | |
| JP | 2007183890 A | 7/2007 | |
| JP | 2009125659 A | 8/2011 | |
| JP | 2013-050832 A | 3/2013 | |
| JP | 2013050832 A | 3/2013 | |
| KR | 10-2015-0009375 A | 1/2015 | |
| KR | 20150009375 A | 1/2015 | |
| WO | 2015083346 A1 | 6/2015 | |
| WO | 2016135477 A1 | 9/2016 | |

OTHER PUBLICATIONS

Korea IP Office, Office Action in Korean Pat. App. No. 10-2016-0178901, dated Aug. 21, 2017 (English—relevant portions).

First Office Action in KR10-2016-0178901, dated Aug. 21, 2017 (in Korean).

First Office Action in KR10-2016-0178901, dated Aug. 21, 2017 (English translation).

Second Office Action in KR10-2016-0178901, dated Feb. 12, 2018 (in Korean).

Second Office Action in KR10-2016-0178901, dated Feb. 12, 2018 (English translation).

First Office Action in JP2016-255134, dated Dec. 19, 2017 (in Japanese).

First Office Action in JP2016-255134, dated Dec. 19, 2017 (English translation).

Second Office Action in JP2016-255134, dated Jun. 12, 2018 (in Japanese).

Second Office Action in JP2016-255134, dated Jun. 12, 2018 (English translation).

* cited by examiner

METHOD AND APPARATUS FOR DETECTING ABNORMAL EVENT RELATED TO PERSON AT HOME

CROSS-REFERENCE TO RELATED APPLICATION

This application claims the benefit of Korean Patent Application No. 10-2016-0178901, filed on Dec. 26, 2016, in the Korean Intellectual Property Office, the disclosure of which is incorporated herein in its entirety by reference.

BACKGROUND

The present invention relates to a service for detecting an abnormal event related to a person at home, and more particularly, to a method and apparatus for detecting an abnormal event related to a person at home based on home electricity use data and informing a user device of the abnormal event.

There are cases where persons, such as elders living alone or sick persons, at home need to be observed and monitored. In these cases, protectors, i.e., people who look after these protected persons periodically visit the protected persons' homes or contact them through phone calls or the like to check their conditions. Recently, closed-circuit television (CCTV) is installed to efficiently check protected persons' conditions. Furthermore, image processing techniques are used to detect protected persons' movements and give automatic notification to protectors.

However, CCTV for remote monitoring is an invasion to protected persons' privacy and is unwelcome to both protectors and protected persons. Moreover, it is necessary to install many CCTV cameras to cover shadow zones and it takes a large amount of network and computing resources to remotely transmit and process data, and therefore, CCTV is economically disadvantageous.

SUMMARY

This work was supported by the Korea Institute of Energy Technology Evaluation and Planning (KETEP) and the Ministry of Trade, Industry & Energy (MOTIE) of the Republic of Korea (No. 20161210200410).

The present invention provides a method and apparatus for detecting an abnormal event related to a person at home based on home electricity use data and informing a user device of the abnormal event.

The present invention also provides a computer readable recording medium having recorded thereon a program for executing the method.

According to an aspect of an exemplary embodiment, there is provided a method of detecting an abnormal event related to a person at home. The method includes measuring home electricity use data in each first predetermined time interval, determining whether an abnormal event related to the person at home has occurred based on the home electricity use data, generating a notification message including the abnormal event related to the person at home when it is determined that the abnormal event related to the person at home has occurred, and transmitting the notification message to a predetermined user device.

The home electricity use data may include at least one of total home electricity usage, the amount of home device's electricity usage, home device's electricity use time, and the number of home device uses.

The method may further include estimating home electricity use data in each second predetermined time interval.

The estimating of the home electricity use data in each second predetermined time interval may use a deep neural network.

The determining of whether the abnormal event related to the person at home has occurred may include determining whether a change in the total home electricity usage in a predetermined time period is equal to or less than a predetermined threshold value.

The determining of whether the abnormal event related to the person at home has occurred may include determining whether a difference between total home electricity usage measured in the first predetermined time interval and total home electricity usage estimated in the second predetermined time interval is equal to or greater than a predetermined threshold value. The second predetermined time interval may come after the first predetermined time interval.

The method may further include storing measured home electricity use data in each first predetermined time interval.

The determining of whether the abnormal event related to the person at home has occurred may include determining whether the number of home device uses is equal to or greater than a first threshold value or equal to or less than a second threshold value, the number of home device uses having been stored for a predetermined time period.

The determining of whether the abnormal event related to the person at home has occurred may include determining whether the home device's electricity use time is equal to or greater than a third threshold value or equal to or less than a fourth threshold value, the home device's electricity use time having been stored for a predetermined time period.

The determining of whether the abnormal event related to the person at home has occurred may include determining whether the amount of home device's electricity usage is equal to or greater than a fifth threshold value or equal to or less than a sixth threshold value, the amount of home device's electricity usage having been stored for a predetermined time period.

The determining of whether the abnormal event related to the person at home has occurred may include determining whether a device use pattern appears, the device use pattern predicted to occur after a use of a home device or predicted to occur at a predetermined time with a predetermined probability.

The determining of whether the abnormal event related to the person at home has occurred may include determining whether an error or overcurrent has occurred during collection and transmission of the home electricity use data based on the home electricity use data.

According to an aspect of another exemplary embodiment, there is provided a computer readable recording medium having recorded thereon a program for executing the method described above.

According to an aspect of another exemplary embodiment, there is provided a server including a measuring unit configured to measure home electricity use data in each first predetermined time interval, a determinator configured to determine whether an abnormal event related to a person at home has occurred based on the home electricity use data, a message generator configured to generate a notification message including the abnormal event related to the person at home when it is determined that the abnormal event related to the person at home has occurred, and a message transmitter configured to transmit the notification message to a predetermined user device.

BRIEF DESCRIPTION OF THE DRAWINGS

Embodiments of the present invention will be more clearly understood from the following detailed description taken in conjunction with the accompanying drawings in which.

DETAILED DESCRIPTION OF THE EMBODIMENTS

Hereinafter, embodiments of the present invention will be described in detail with reference to the accompanying drawings in which like numbers refer to like elements and the sizes of elements may be exaggerated for clarity.

Figure 1:
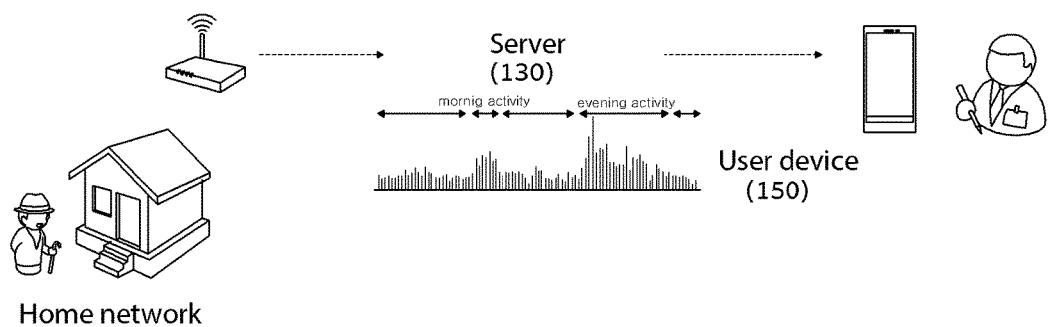
FIG. 1 is a schematic diagram of a system for detecting an abnormal event related to a person at home, according to some embodiments of the present invention.

FIG. 1 is a schematic diagram of a system for detecting an abnormal event related to a person at home, according to some embodiments of the present invention.

A server 130 detects an abnormal event related to a person at home based on home electricity use data and generates and transmits a notification message including the abnormal event to a user device 150 based on the detection of the abnormal event.

It is apparent to those skilled in the art that the user device 150 includes a mobile terminal and may be any one of other various types of terminals.

When a protector such as a social worker needs to observe and monitor a protected person, such as an elder living alone or a sick person, at home, the social worker may check the protected person's condition at home using the user device 150 based on the notification message transmitted from the server 130.

Figure 2:
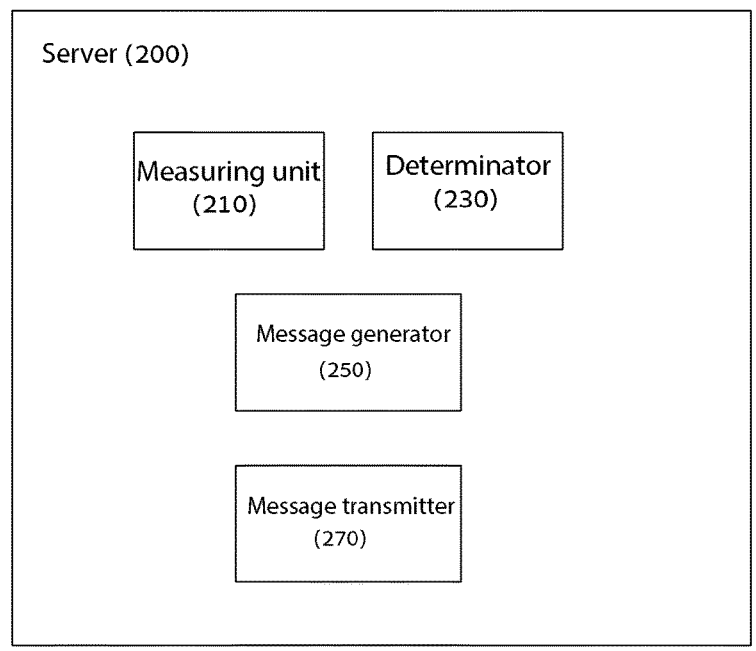
FIG. 2 is a schematic block diagram of a server for detecting an abnormal event related to a person at home, according to some embodiments of the present invention.

FIG. 2 is a schematic block diagram of a server 200 for detecting an abnormal event related to a person at home, according to some embodiments of the present invention.

The server 200 includes a measuring unit 210, a determinator 230, a message generator 250, and a message transmitter 270. Although not shown, the server 200 also includes a storage.

The measuring unit 210 measures home electricity use data in each first predetermined time interval. The home electricity use data includes at least one of total home electricity usage, the amount of home device's electricity usage, home device's electricity use time, and the number of home device uses. The amount of home device's electricity usage, home device's electricity use time, and the number of home device uses are measured with respect to an individual device or a group of individual devices.

For example, the measuring unit 210 may measure total home electricity usage at a time interval of one hour or 15 minutes. Alternatively, the measuring unit 210 may measure total home electricity usage at each second, thereby measuring the total home electricity usage in real time. The first predetermined time interval may vary with the configuration of the server 200.

The measuring unit 210 measures the amount of electricity usage of an individual device at home. In addition, the measuring unit 210 estimates home electricity use data in each second predetermined time interval. Consequently, the measuring unit 210 measures the amount of electricity usage of an individual device at home and also estimates the amount of electricity usage of the individual device at home, which is described in detail below with reference to FIG. 3.

In other embodiments, the measuring unit 210 may be provided outside the server 200. In this case, the server 200 may obtain home electricity use data from the measuring unit 210.

The determinator 230 determines whether an abnormal event related to a person at home has occurred based on home electricity use data.

The determinator 230 determines whether a change in total home electricity usage in a predetermined time period is equal to or less than a predetermined threshold value. For example, when a change in total home electricity usage for the previous 24 hours is equal to or less than the threshold value, the determinator 230 determines that an abnormal event related to a person at home has occurred on the ground that there has been no change in the total home electricity usage. A change in total home electricity usage, i.e., a total home electricity usage variance, may be calculated using Equation 1:

$$\text{total home electricity usage variance} = (\text{maximum total home electricity usage per unit time} - \text{minimum total home electricity usage per unit time})/(\text{average total home electricity usage per unit time}). \quad (1)$$

It is apparent to those skilled in the art that calculation of the total home electricity usage variance is not limited to a particular equation and may be performed using other methods. The threshold value may be set to a numerical value, e.g., 0.25, but it is apparent to those skilled in the art that the threshold value may vary with the configuration of the server 200.

The determinator 230 determines whether a difference between total home electricity usage measured in the first predetermined time interval and total home electricity usage estimated in the second predetermined time interval is equal to or greater than a predetermined threshold value. The second predetermined time interval is a time period following the first predetermined time interval. For example, the determinator 230 determines whether a difference between total home electricity usage measured for the previous 24 hours and total home electricity usage estimated for the next 24 hours is equal to or greater than the predetermined threshold value.

When the difference is equal to or greater than the predetermined threshold value, the determinator 230 determines that an abnormal event related to a person at home has occurred. A method of estimating total home electricity usage is described below with reference to FIG. 3.

The storage stores, in each first predetermined time interval, home electricity use data measured by the measuring unit 210.

The determinator 230 determines whether the number of home device uses, which has been stored for a predetermined time period, is equal to or greater than a first threshold value or equal to or less than a second threshold value. When the number of home device uses during a monitoring time/day is equal to or greater than the first threshold value or equal to or less than the second threshold value, the determinator 230 determines that an abnormal event related to a person at home has occurred on the ground that the number of home device uses is abnormal.

For example, the storage stores, for a predetermined time period, the numbers of uses of a home device such as an electric rice cooker, a washing machine, or a microwave oven on each day of the week. The determinator 230 calculates an upper value, i.e., 90%, of the distribution of the numbers of uses of the home device and a lower value, i.e., 10%, of the distribution of the numbers of uses of the home device. When the number of uses of the home device on a monitoring day is equal to or greater than the upper value of 90% or equal to or less than the lower value of 10%, the determinator 230 determines that an abnormal event related to a person at home has occurred on the ground that the number of uses of the home device is abnormal.

The determinator 230 determines whether home device's electricity use time stored for a predetermined time period is equal to or greater than a third threshold value or equal to or less than a fourth threshold value. When home device's electricity use time during a monitoring time/day is equal to or greater than the third threshold value or equal to or less than the fourth threshold value, the determinator 230 determines that an abnormal event related to a person at home has occurred on the ground the home device's electricity use time is abnormal.

For example, the storage stores, for a predetermined time period, electricity use times of a home device such as TV on each day of the week. The determinator 230 calculates an upper value, i.e., 90%, of the distribution of electricity use times of the home device and a lower value, i.e., 10%, of the distribution of electricity use times of the home device. When the electricity use time of the home device on a monitoring day is equal to or greater than the upper value of 90% or equal to or less than the lower value of 10%, the determinator 230 determines that an abnormal event related to a person at home has occurred on the ground that the electricity use time of the home device is abnormal.

The determinator 230 determines whether the amount of home device's electricity usage stored for a predetermined time period is equal to or greater than a fifth threshold value or equal to or less than a sixth threshold value. When home device's electricity usage during a monitoring time/day is equal to or greater than the fifth threshold value or equal to or less than the sixth threshold value, the determinator 230 determines that an abnormal event related to a person at home has occurred on the ground that the amount of home device's electricity usage is abnormal.

For example, the storage stores, for a predetermined time period, the amounts of electricity usage of a home device such as an electric light on each day of the week. The determinator 230 calculates an upper value, i.e., 90%, of the distribution of the amounts of electricity usage of the home device and a lower value, i.e., 10%, of the distribution of the amounts of electricity usage of the home device. When the amount of electricity usage of the home device on a monitoring day is equal to or greater than the upper value of 90% or equal to or less than the lower value of 10%, the determinator 230 determines that an abnormal event related to a person at home has occurred on the ground that the amount of electricity usage of the home device is abnormal.

The determinator 230 determines whether a device use pattern predicted to occur after a use of a home device or predicted to occur at a predetermined time with a high probability appears. When the predicted device use pattern is different from a usual device use pattern, the determinator 230 determines that an abnormal event related to a person at home has occurred on the ground that a device use pattern association rule is abnormal.

The determinator 230 uses correlation analysis to predict a device use pattern. The detailed description of the correlation analysis is disclosed in Korean Patent No. 10-1642044, entitled "Method of Deciding Uncommonness of Electric Device Usage Associated with Electric Energy Consuming Device" (issued on Jul. 18, 2016), which is incorporated herein by reference.

The determinator 230 also determines whether an error or overcurrent has occurred during collection and transmission of home electricity use data based on the home electricity use data. In detail, when total home electricity usage is not received by the server 200 for a predetermined time period (e.g., an hour), the determinator 230 determines that an error has occurred during the collection and transmission of the home electricity use data. When the total home electricity usage is maintained equal to or greater than a predetermined threshold value for a predetermined time period, the determinator 230 determines that an overcurrent has occurred. When the determinator 230 determines that a system abnormality such as one of the abnormalities described above has occurred, a notification message including the event of the system abnormality is generated and transmitted to a user device.

When the determinator 230 determines that an abnormal event related to a person at home has occurred on any one of the grounds described above, the message generator 250 generates a notification message including the abnormal event related to the person at home.

The message transmitter 270 transmits the notification message to a predetermined user device.

It is apparent to those skilled in the art that the predetermined user device includes a mobile terminal and may be any one of other various types of terminals.

When a protector such as a social worker needs to observe and monitor a person, such as an elder living alone or a sick person, at home, the social worker may check the person's condition at home using the predetermined user device based on a notification message transmitted from the server 200.

Figure 3:
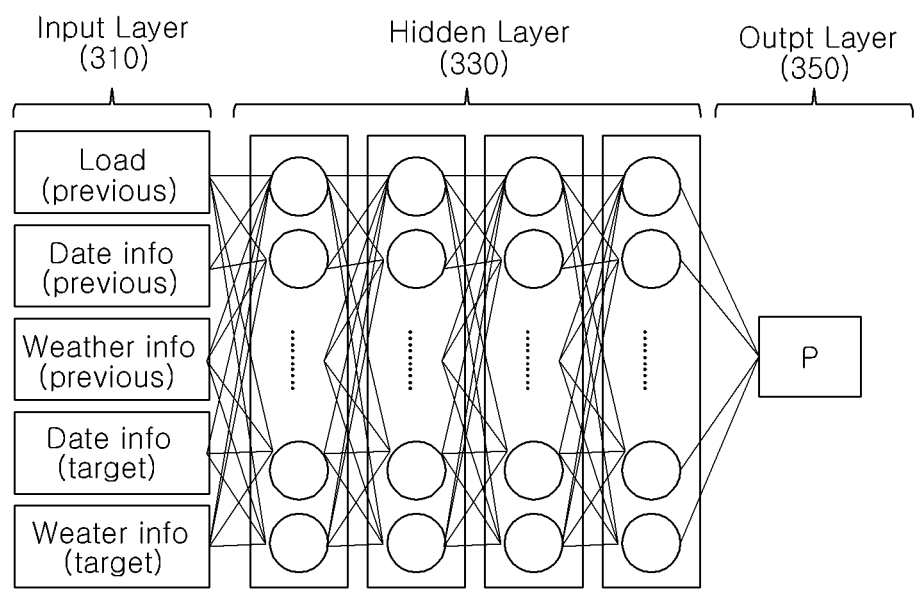
FIG. 3 is a schematic diagram of a deep neural network (DNN) used when a server estimates home electricity use data, according to some embodiments of the present invention.

FIG. 3 is a schematic diagram of a deep neural network (DNN) used when the server 200 estimates home electricity use data, according to some embodiments of the present invention.

The measuring unit 210 of the server 200 estimates home electricity use data in each predetermined time interval. The predetermined time interval varies. For example, the predetermined time interval may be 24 hours or each day of the week.

For example, the measuring unit 210 estimates the amount of home electricity usage in a target time interval based on input data of the previous time interval (e.g., the previous 24 hours) and input data of the target time interval. The input data of the previous time interval includes the amount of home electricity usage measured in the previous time interval, a day on which the previous time interval falls, time information, and weather information. The weather information includes temperature, humidity, the amount of clouds, etc. The input data of the target time interval includes a day on which the target time interval falls, time information, and weather information.

As shown in FIG. 3, the measuring unit 210 estimates the amount of home electricity usage using the DNN.

The DNN is an artificial neural network (ANN) including an input layer 310, an output layer 350, and a plurality of hidden layers 330 between the input layer 310 and the output layer 350. Although variables assigned to the hidden layers 330 are not known in the DNN, each of the hidden layers 330 is connected to adjacent layers coming before/after and a complex nonlinear relationship between input and output variables can eventually be mathematically modeled.

The measuring unit 210 receives the input data of the previous time interval and the input data of the target time interval through the input layer 310 of the DNN and outputs the amount of home electricity usage in the target time interval through the output layer 350 of the DNN.

Figure 4:
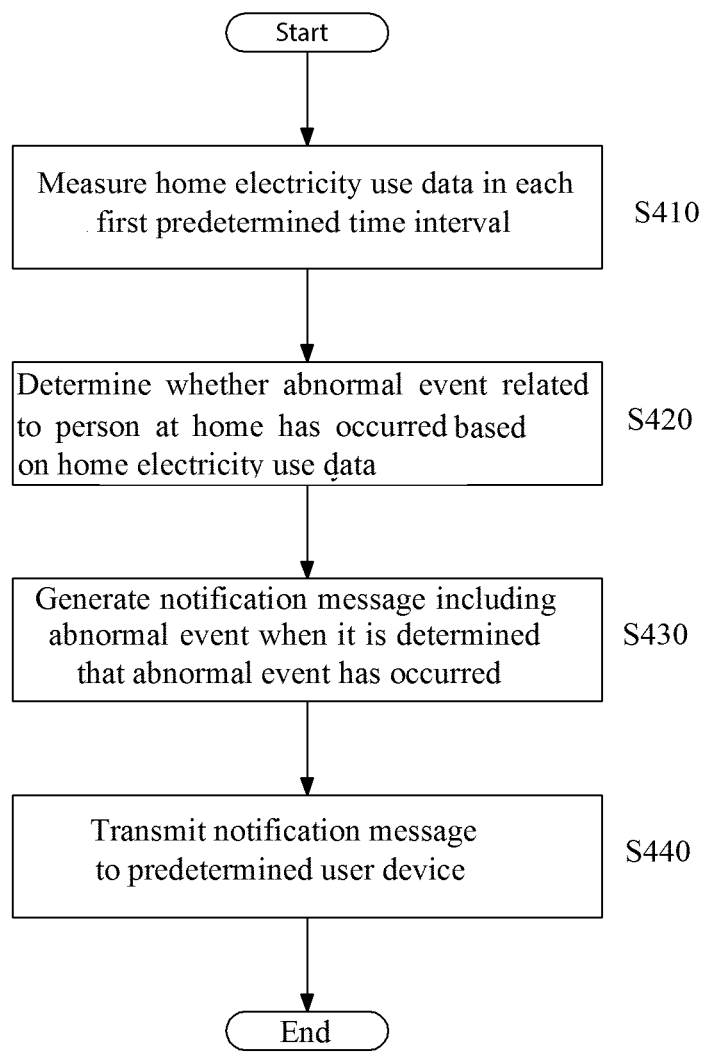
FIG. 4 is a flowchart of a method of detecting an abnormal event related to a person at home, according to some embodiments of the present invention.

FIG. 4 is a flowchart of a method of detecting an abnormal event related to a person at home, according to some embodiments of the present invention.

The server 200 measures home electricity use data in each first predetermined time interval in operation S410.

The home electricity use data includes at least one of total home electricity usage, the amount of home device's electricity usage, home device's electricity use time, and the number of home device uses. The amount of home device's electricity usage, home device's electricity use time, and the number of home device uses are measured with respect to an individual device or a group of individual devices. The first predetermined time interval may vary with the configuration of the server 200. The server 200 measures total home electricity usage and electricity usage of an individual device at home. In addition, the server 200 estimates home electricity use data in each second predetermined time interval. Consequently, the server 200 measures the electricity usage of the individual device and also estimates the electricity usage of the individual device, which has been described above with reference to FIG. 3.

The server 200 determines whether an abnormal event related to a person at home has occurred based on the home electricity use data in operation S420.

The server 200 determines whether a change in total home electricity usage in a predetermined time period is equal to or less than a predetermined threshold value. For example, when a change in total home electricity usage during the previous 24 hours is equal to or less than the threshold value, the server 200 determines that an abnormal event related to the person at home has occurred on the ground that there has been no change in the total home electricity usage. The change in the total home electricity usage, i.e., a total home electricity usage variance, may be calculated using Equation 1 described above, but it is apparent to those skilled in the art that calculation of the total home electricity usage variance is not limited to a particular equation and may be performed using other methods.

The threshold value may be set to a numerical value, e.g., 0.25, but it is apparent to those skilled in the art that the threshold value may vary with the configuration of the server 200.

The server 200 determines whether a difference between the total home electricity usage measured in the first predetermined time interval and total home electricity usage estimated in the second predetermined time interval is equal to or greater than a predetermined threshold value. The second predetermined time interval is a time period following the first predetermined time interval. For example, the server 200 determines whether a difference between total home electricity usage measured for the previous 24 hours and total home electricity usage estimated for the next 24 hours is equal to or greater than the predetermined threshold value.

When the difference is equal to or greater than the predetermined threshold value, the server 200 determines that an abnormal event related to the person at home has occurred. A method of estimating the total home electricity usage has been described above with reference to FIG. 3.

The server 200 stores the measured home electricity use data in each first predetermined time interval.

The server 200 determines whether the number of home device uses, which has been stored for a predetermined time period, is equal to or greater than a first threshold value or equal to or less than a second threshold value. When the number of home device uses during a monitoring time/day is equal to or greater than the first threshold value or equal to or less than the second threshold value, the server 200 determines that an abnormal event related to the person at home has occurred on the ground that the number of home device uses is abnormal.

For example, the server 200 stores, for a predetermined time period, the number of uses of a home device such as an electric rice cooker, a washing machine, or a microwave oven on each day of the week. The server 200 calculates an upper value, i.e., 90%, of the distribution of the numbers of uses of the home device and a lower value, i.e., 10%, of the distribution of the numbers of uses of the home device. When the number of uses of the home device on a monitoring day is equal to or greater than the upper value of 90% or equal to or less than the lower value of 10%, the server 200 determines that an abnormal event related to the person at home has occurred on the ground that the number of uses of the home device is abnormal.

The server 200 determines whether home device's electricity use time stored for a predetermined time period is equal to or greater than a third threshold value or equal to or less than a fourth threshold value. When home device's electricity use time during a monitoring time/day is equal to or greater than the third threshold value or equal to or less than the fourth threshold value, the server 200 determines that an abnormal event related to the person at home has occurred on the ground that the home device's electricity use time is abnormal.

For example, the server 200 stores, for a predetermined time period, electricity use times of a home device such as TV on each day of the week. The server 200 calculates an upper value, i.e., 90%, of the distribution of electricity use times of the home device and a lower value, i.e., 10%, of the distribution of electricity use times of the home device. When the electricity use time of the home device on a monitoring day is equal to or greater than the upper value of 90% or equal to or less than the lower value of 10%, the server 200 determines that an abnormal event related to the person at home has occurred on the ground that the electricity use time of the home device is abnormal.

The server 200 determines whether the amount of home device's electricity usage stored for a predetermined time period is equal to or greater than a fifth threshold value or equal to or less than a sixth threshold value. When the amount of home device's electricity usage during a monitoring time/day is equal to or greater than the fifth threshold value or equal to or less than the sixth threshold value, the server 200 determines that an abnormal event related to the person at home has occurred on the ground that the amount of home device's electricity usage is abnormal.

For example, the server 200 stores, for a predetermined time period, the amounts of electricity usage of a home device such as an electric light on each day of the week. The server 200 calculates an upper value, i.e., 90%, of the distribution of the amounts of electricity usage of the home device and a lower value, i.e., 10%, of the distribution of the amounts of electricity usage of the home device. When the amount of electricity usage of the home device on a monitoring day is equal to or greater than the upper value of 90% or equal to or less than the lower value of 10%, the server 200 determines that an abnormal event related to the person at home has occurred on the ground that the amount of electricity usage of the home device is abnormal.

The server 200 determines whether a device use pattern predicted to occur after a use of a home device or predicted to occur at a predetermined time with a high probability appears. When the predicted device use pattern is different from a usual device use pattern, the server 200 determines that an abnormal event related to the person at home has occurred on the ground that a device use pattern association rule is abnormal. The server 200 uses correlation analysis to predict the device use pattern.

The server 200 also determines whether an error or overcurrent has occurred during collection and transmission of the home electricity use data based on the home electricity use data. In detail, when the total home electricity usage is not received for a predetermined time period (e.g., an hour), the server 200 determines that an error has occurred during the collection and transmission of the home electricity use data. In addition, when the total home electricity usage is maintained equal to or greater than a predetermined threshold value for a predetermined time period, the server 200 determines that an overcurrent has occurred. When the server 200 determines that a system abnormality such as one of the abnormalities described above has occurred, the server 200 generates a notification message including the event of the system abnormality and transmits the notification message to a user device.

When the server 200 determines that an abnormal event related to the person at home has occurred on any one of the grounds described above, the server 200 generates a notification message including the abnormal event related to the person at home in operation S430.

The server 200 transmits the notification message to a predetermined user device in operation S440. It is apparent to those skilled in the art that the predetermined user device includes a mobile terminal and may be any one of other various types of terminals.

According to some embodiments of the present invention, a method and apparatus for detecting an abnormal event related to a person at home provide a service for detecting the abnormal event related to the person at home based on home electricity use data and informing a user device of the abnormal event. The method and apparatus allow a user such as a guardian or protector of a person at home to check an abnormal event related to the person in real time using a user device. In addition, since only home electricity use data is used to analyze an abnormal event related to a person at home, the intended goal can be accomplished with minimum personal information leakage. Furthermore, necessary equipment is simplified and computing cost is decreased.

While the present invention has been particularly shown and described with reference to embodiments thereof, it will be understood that various changes in form and details may be made therein without departing from the spirit and scope of the following claims.

For example, the server 200 may also include a bus connected to units of each element shown in FIG. 2, at least one processor connected to the bus, and memory connected to the bus to store commands, received messages, or generated messages. The memory is also connected to the at least one processor which executes the commands.

The present invention can also be embodied as computer readable codes on a computer readable recording medium. The computer readable recording medium is any data storage device that can store data which can be thereafter read by a computer system. Examples of the computer readable recording medium include magnetic storage media (e.g., ROM, floppy disks, hard disks, etc.), optical recording media (e.g., CD-ROMs, or DVDs), and storage media such as carrier waves (e.g., transmission through the Internet). The computer readable recording medium can also be distributed over network coupled computer systems so that the computer readable code is stored and executed in a distributed fashion.

What is claimed is:

1. A server comprising:
a measuring unit configured to measure home electricity use data in each first predetermined time interval, wherein the home electricity use data comprises at least one of total home electricity usage, the amount of home device's electricity usage, home device's electricity use time, and the number of home device uses, the measuring unit including an estimator;
the estimator including a deep neural network having an input layer, an output layer, and a plurality of hidden layers between the input layer and the output layer, the input layer receiving at least one among an amount of home electricity usage measured in a previous time interval and weather information, wherein the estimator is configured to estimate the home electricity use data;
a determinator configured to determine whether an abnormal event related to a person at home has occurred based on the measured and the estimated home electricity use data;
a message generator configured to generate a notification message including the abnormal event related to the person at home when it is determined that the abnormal event related to the person at home has occurred; and
a message transmitter configured to transmit the notification message to a predetermined user device.

2. The server of claim 1, wherein the estimator is configured to estimate home electricity use data in each second predetermined time interval.

3. The server of claim 1, wherein the home electricity use data comprises total home electricity usage; and
wherein the determinator determines whether a change in the total home electricity usage in a predetermined time period is equal to or less than a predetermined threshold value.

4. The server of claim 1, wherein the home electricity use data comprises total home electricity usage; and
wherein the determinator determines whether a difference between total home electricity usage measured in the first predetermined time interval and total home electricity usage estimated in the second predetermined time interval is equal to or greater than a predetermined threshold value, and the second predetermined time interval comes after the first predetermined time interval.

5. The server of claim 1, further comprising a storage configured to store measured home electricity use data in each first predetermined time interval.

6. The server of claim 5, wherein the home electricity use data comprises the number of home device uses; and
wherein the determinator determines whether the number of home device uses is equal to or greater than a first threshold value or equal to or less than a second threshold value, the number of home device uses having been stored for a predetermined time period.

7. The server of claim 5, wherein the home electricity use data comprises the home device's electricity use time; and
wherein the determinator determines whether the home device's electricity use time is equal to or greater than a third threshold value or equal to or less than a fourth threshold value, the home device's electricity use time having been stored for a predetermined time period.

8. The server of claim 5, wherein the home electricity use data comprises the amount of home device's electricity usage; and
wherein the determinator determines whether the amount of home device's electricity usage is equal to or greater than a fifth threshold value or equal to or less than a sixth threshold value, the amount of home device's electricity usage having been stored for a predetermined time period.

9. The server of claim 5, wherein the determinator determines whether a device use pattern appears, the device use pattern predicted to occur after a use of a home device or predicted to occur at a predetermined time with a predetermined probability.

10. The server of claim 1, wherein the determinator determines whether an error or overcurrent has occurred during collection and transmission of the home electricity use data based on the home electricity use data.

11. A method of detecting an abnormal event related to a person at home, the method comprising:
measuring home electricity use data in each first predetermined time interval, wherein the home electricity use data comprises at least one of total home electricity usage, the amount of home device's electricity usage, home device's electricity use time, and the number of home device uses;
estimating the home electricity use data using a deep neural network having an input layer, an output layer, and a plurality of hidden layers between the input layer and the output layer, with the input layer receiving at least one among an amount of home electricity usage measured in a previous time interval and weather information;
determining whether an abnormal event related to the person at home has occurred based on the measured and the estimated home electricity use data;
generating a notification message including the abnormal event related to the person at home when it is determined that the abnormal event related to the person at home has occurred; and
transmitting the notification message to a predetermined user device.

12. The method of claim 11, wherein the estimating estimates home electricity use data in each second predetermined time interval.

13. The method of claim 11, wherein the home electricity use data comprises total home electricity usage; and
wherein the determining of whether the abnormal event related to the person at home has occurred comprises determining whether a change in the total home electricity usage in a predetermined time period is equal to or less than a predetermined threshold value.

14. The method of claim 11, wherein the home electricity use data comprises total home electricity usage; and
wherein the determining of whether the abnormal event related to the person at home has occurred comprises determining whether a difference between total home electricity usage measured in the first predetermined time interval and total home electricity usage estimated in the second predetermined time interval is equal to or greater than a predetermined threshold value, and the second predetermined time interval comes after the first predetermined time interval.

15. The method of claim 11, further comprising storing measured home electricity use data in each first predetermined time interval.

16. The method of claim 15, wherein the home electricity use data comprises the number of home device uses; and
wherein the determining of whether the abnormal event related to the person at home has occurred comprises determining whether the number of home device uses is equal to or greater than a first threshold value or equal to or less than a second threshold value, the number of home device uses having been stored for a predetermined time period.

17. The method of claim 15, wherein the home electricity use data comprises home device's electricity use time; and
wherein the determining of whether the abnormal event related to the person at home has occurred comprises determining whether the home device's electricity use time is equal to or greater than a third threshold value or equal to or less than a fourth threshold value, the home device's electricity use time having been stored for a predetermined time period.

18. The method of claim 15, wherein the home electricity use data comprises the amount of home device's electricity usage; and
wherein the determining of whether the abnormal event related to the person at home has occurred comprises determining whether the amount of home device's electricity usage is equal to or greater than a fifth threshold value or equal to or less than a sixth threshold value, the amount of home device's electricity usage having been stored for a predetermined time period.

19. The method of claim 15, wherein the determining of whether the abnormal event related to the person at home has occurred comprises determining whether a device use pattern appears, the device use pattern predicted to occur after a use of a home device or predicted to occur at a predetermined time with a predetermined probability.

20. The method of claim 11, wherein the determining of whether the abnormal event related to the person at home has occurred comprises determining whether an error or overcurrent has occurred during collection and transmission of the home electricity use data based on the home electricity use data.

* * * * *